(12) United States Patent
Chao et al.

(10) Patent No.: US 7,588,963 B2
(45) Date of Patent: Sep. 15, 2009

(54) METHOD OF FORMING OVERHANG SUPPORT FOR A STACKED SEMICONDUCTOR DEVICE

(75) Inventors: Te-Tsung Chao, Hsin-Chu (TW); Mirng-Ji Lii, Hsin-Chu (TW); Chung-Yi Lin, Hsin-Chu (TW); Abel Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 290 days.

(21) Appl. No.: 11/495,054

(22) Filed: Jul. 28, 2006

(65) Prior Publication Data

US 2006/0270112 A1  Nov. 30, 2006

Related U.S. Application Data

(62) Division of application No. 10/881,605, filed on Jun. 30, 2004, now Pat. No. 7,116,002.

(51) Int. Cl.
*H01L 21/58* (2006.01)

(52) U.S. Cl. ............... 438/109; 438/118; 257/E21.505

(58) Field of Classification Search ............ 438/109, 438/118, FOR. 369; 257/E21.505
See application file for complete search history.

(56) References Cited

U.S. PATENT DOCUMENTS

| | | | |
|---|---|---|---|
| 4,963,002 A | 10/1990 | Tagusa et al. | |
| 5,804,882 A | 9/1998 | Tsukagoshi et al. | |
| 6,020,648 A | 2/2000 | MacPherson | |
| 6,133,637 A * | 10/2000 | Hikita et al. | 257/777 |
| 6,147,401 A | 11/2000 | Solberg | |
| 6,355,500 B2 * | 3/2002 | Miyazaki et al. | 438/106 |
| 6,472,758 B1 | 10/2002 | Glenn et al. | |
| 6,621,172 B2 | 9/2003 | Nakayama et al. | |
| 6,650,019 B2 | 11/2003 | Glenn et al. | |
| 6,664,643 B2 | 12/2003 | Emoto | |
| 6,680,219 B2 | 1/2004 | Reyes et al. | |
| 6,717,251 B2 | 4/2004 | Matsuo et al. | |
| 2002/0074668 A1 | 6/2002 | Hofstee et al. | |
| 2003/0045029 A1 | 3/2003 | Emoto | |
| 2004/0245652 A1 | 12/2004 | Ogata | |
| 2005/0258545 A1 * | 11/2005 | Kwon | 257/777 |
| 2006/0270112 A1 * | 11/2006 | Chao et al. | 438/109 |
| 2007/0152314 A1 * | 7/2007 | Manepalli et al. | 257/686 |
| 2007/0278658 A1 * | 12/2007 | Karnezos et al. | 257/692 |

* cited by examiner

*Primary Examiner*—George Fourson
(74) *Attorney, Agent, or Firm*—Slater & Matsil, L.L.P.

(57) ABSTRACT

A stacked, multi-die semiconductor device and method of forming thereof. A preferred embodiment comprises disposing a stack of semiconductor dies to a substrate. The stacking arrangement is such that a lateral periphery of an upper die is cantilevered over a lower die thereby forming a recess. A supporting adhesive layer containing a filler is disposed upon the substrate about the lateral periphery of the lower die and substantially filling the recess. In one preferred embodiment, the filler comprises microspheres. In another preferred embodiment, the filler comprises a dummy die, an active die, or a passive die.

23 Claims, 6 Drawing Sheets

METHOD OF FORMING OVERHANG SUPPORT FOR A STACKED SEMICONDUCTOR DEVICE

This application is a divisional of patent application Ser. No. 10/881,605, entitled "Overhang Support for a Stacked Semiconductor Device, and Method of Forming Thereof," filed Jun. 30, 2004, now U.S. Pat. No. 7,116,002 which application is incorporated herein by reference.

TECHNICAL FIELD

This invention relates generally to a device and method involving semiconductor packaging, and more particularly to a semiconductor package with stacked dies and a method for its manufacture.

BACKGROUND

The increasing demand for electronic devices that are smaller, lighter, and yet more functional has resulted in a concomitant demand for semiconductor packages that have smaller outlines and mounting footprints, yet which are capable of increased component packaging densities. One approach to satisfying this demand has been the development of techniques for stacking the semiconductor dies or chips contained in the package on top of one another. An example of die-stacking techniques is disclosed, for example, in U.S. Pat. No. 6,650,019 to T. P. Glenn et al.

Figure 1:
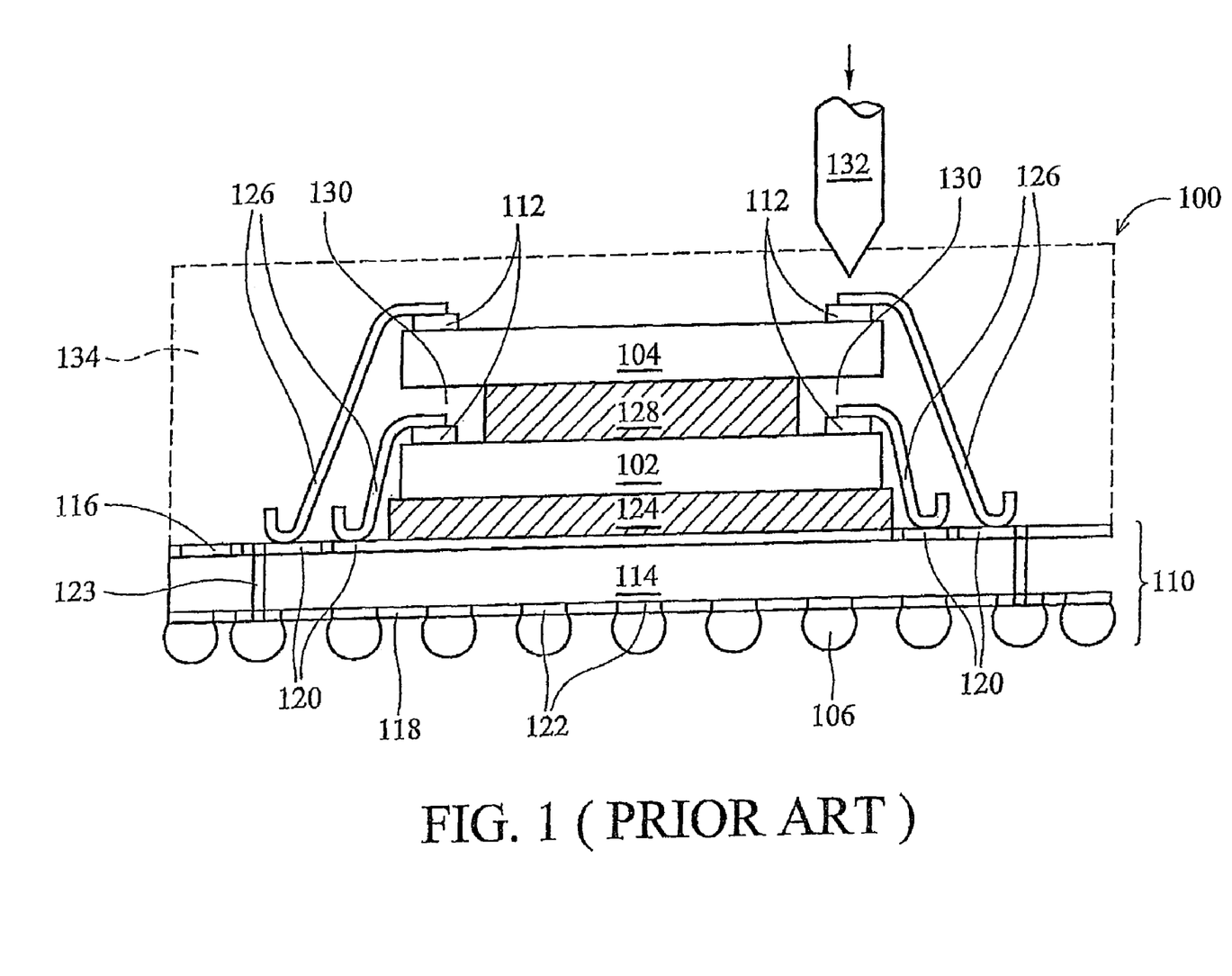
FIG. 1 is a cross-sectional side elevation view of a prior art semiconductor package with stacked dies.

FIG. 1 is a cross-sectional side elevation view of a prior art semiconductor package 100 incorporating two stacked dies 102 and 104. The package 100 illustrated is a ball grid array ("BGA") package, having balls of solder 106 formed on the bottom surface of the substrate 110 that function as input/output terminals of the package. The package 100 includes a conventional interconnective substrate 110 and a first semiconductor die 102 mounted on a top surface of the substrate 110. A second die 104 has been stacked, i.e., mounted, on top of the first die 102. The dies 102 and 104 typically include a plurality of input/output wire bonding pads 112 located at the peripheral edges of their respective top surfaces.

The substrate 110 may comprise a flexible resin tape, a rigid fiber-glass/copper sheet laminate, a co-fired ceramic coupon, or a metal lead frame, all of known types in the industry, depending on the particular type of semiconductor package 100. The connective substrate 110 illustrated in the BGA package 100 shown in FIG. 1 comprises a layer 114 of an insulating material, e.g., a polyimide resin film, laminated between conductive layers 116 and 118, each of which comprises a metal, e.g., copper or aluminum, and makes up the respective top and bottom surfaces of the substrate.

The conductive layers 116 and 118 are typically patterned, e.g., by photolithography and etching techniques, to define wire bonding pads 120 and circuit traces in the top layer 116, and solder ball mounting lands 122 in the bottom layer 118. The wire bonding pads 120 and traces (not illustrated) are typically connected to the solder ball lands 122 through the thickness of the insulative layer 114 by vias 123, e.g., plated-through holes in the layers. Either or both of the conductive layers 116 and 118 may be coated with an insulating solder mask (not illustrated) that has inside openings, through which the respective metal pads for wire bonding 120 and/or solder ball lands 122 are exposed, and which serve to prevent bridging between the pads and/or lands by accidental solder splashes.

In FIG. 1, the first die 102 is conventionally mounted on the top surface of the substrate 110 with, e.g., a layer of an adhesive or an adhesive film 124. The first die 102 is electrically connected to the substrate 110 by a plurality of fine, conductive wires 126, typically gold or aluminum, which connect the pads 112 on the die 102 and the pads 120 on the substrate 110.

The second die 104 is mounted on the top surface of the first die 102 with an adhesive layer or film 128 that generally has a lateral perimeter positioned within the central area of the top surface of the first die, and inside of the peripheral wire bonding pads 112 thereon. That is, the adhesive layer 128 generally does not contact or cover either the wire bonding pads 112 or the conductive wires 126 bonded thereto. The adhesive layer 128 positions the second die 104 a sufficient distance above the first die 102 to prevent the second die from contacting the conductive wires 126 that are bonded to the first die 102. This helps prevent shorting out or breaking the bonding pads 112 and wires 126, and thus defines a peripheral space 130 between the two dies that extends around the entire perimeter of the adhesive layer 128. The second die 104 may be wire bonded to the substrate 114 in the same fashion as the first die 102. One or more additional dies (not illustrated) may be stacked in tandem on top of the second die 104 using the same technique.

Figure 2:
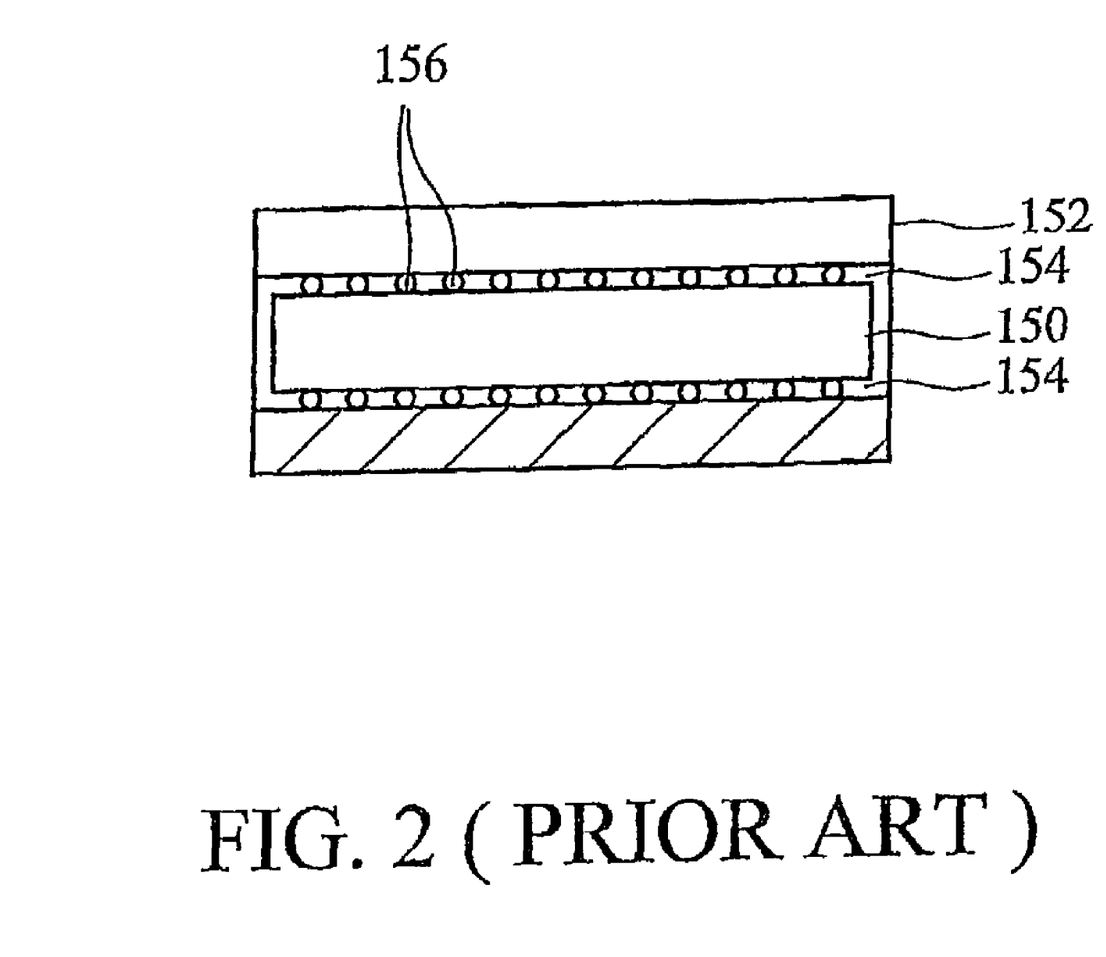
FIG. 2 is a cross-sectional side elevation view of a prior art device having two-stacked semiconductor dies and microspheres in the adhesive.

FIG. 2 is a cross-sectional side elevation view of a prior art package having two stacked dies 150 and 152 with an alternatively filled adhesive 154. If, for example, the die-attach equipment lacks precise control, it may be desirable to include an alternate mechanism for precisely controlling the final bond line thickness of the adhesive layer 154 distributed between the opposing surfaces of the two dies 150 and 152. As shown in the FIG. 2, this may be achieved by filling the uncured, fluid adhesive 154 with a quantity of microspheres 156, each having a diameter approximately equal to the desired final thickness of the adhesive layer 154. As illustrated in FIG. 2, the second die 152 is pressed down onto the filled adhesive 154 until the bottom surface of the second die 152 bottoms out on the microspheres 156. The bottom surface of the second die 152 is spaced apart from the top surface of the first die 150 by approximately a single layer of the microspheres 156.

The material of the microspheres 156 may be selected from a wide array of materials such as glass, polymer, silicon dioxide, silicon nitride, or polytetraflouroethylene ("PTFE"). The microspheres 156 may be fabricated using a variety of known techniques such as pumping or blowing a molten material through a nozzle under high pressure to atomize it, then cooling or curing the varying-sized spherical bodies thereby produced with a bath of, e.g., air, water or oil. The microspheres 156 then may be passed through a series of screens of graduated mesh sizes to grade them by diameter.

With reference back to FIG. 1, in the stacked-die package 100 the dies 102 and 104 generally are wire bonded sequentially, typically with automated wire bonding equipment employing well-known thermal-compression or ultrasonic wire bonding techniques. As shown in FIG. 1, during the wire bonding process the head 132 of a wire bonding apparatus applies a downward pressure on a conductive wire 126 held in contact with a wire bonding pad 112 on the die to effect a weld or bond of the wire to the pad.

Because the wire bonding pads 112 are located in the peripheral area of the respective top surfaces of the two dies, the wire bonding generally entails the application of a relatively large, localized force in the direction of the arrow shown in FIG. 1 to the outside portion of the die. This generally does not present a problem with the bottom die 102 as it is supported from below by the substrate 110 and the adhesive layer 124. In the case of the second, top die 104, however, its peripheral portion is cantilevered out over the peripheral portion of the bottom die 102 by the adhesive layer 128, and is therefore unsupported from below. Consequently, the top die 104 may crack or fracture during the wire bonding procedure, which may result in the entire assembly being rendered unusable.

Another problem that may result from prior art die stacking techniques also relates to the peripheral space 130 created between the opposing surfaces of the first and second dies 102 and 104, as well as the perimeter of the adhesive layer 128. In particular, the plastic molding material used to form the body 134 that encapsulates the dies generally penetrates into the peripheral space during the molding process and forms a wedge between the two dies. If the encapsulating material has a thermal coefficient of expansion different from that of the adhesive spacer 128, it is possible for this wedge to expand within the peripheral space 130 under large changes in temperature of the package 100, thereby potentially fracturing one or both of the dies, again resulting in a defective package.

Another disadvantage of the prior art die stacking techniques also relates to the peripheral space 130 created between the opposing surfaces of the first and second dies 102 and 104 and the force exerted by the wire bonding head 132. In particular, the downward force of the head may deform the second die 104, thereby inducing separation or delamination of the bottom surface of the top die 104 and the top surface of the second adhesive layer 128.

Another disadvantage of the prior art die stacking techniques again relates to the peripheral space 130 and the deflection caused by the wire bonding head 132. In particular, deformation may occur within the conductive wires 126 or within the wire bond pads 112, sometimes causing immediate breakage. Alternatively, repeated deformation and flexure of the die during the bonding process generates vibrations through out the semiconductor package, in which the electrical connections may be fatigued due to the vibrations. While fatigue may not cause immediate breakage during manufacture, electrical component fatigue may reduce the lifetime and the reliability of the device.

SUMMARY OF THE INVENTION

These and other problems are generally solved or circumvented, and technical advantages are generally achieved, by preferred embodiments of the present invention that provide an overhang support for a stacked, multi-die semiconductor device, and method of forming thereof.

In accordance with a preferred embodiment of the invention, a method for stacking dies of different size comprises stacking a plurality of dies. The coterminous, opposing faces of the stacked dies are attached such that a die higher in the stack has a lateral dimension, length or width, greater than a lateral dimension of a lower die in the stack below. Therefore, at least some of a periphery of the upper die is cantilevered over a periphery of the lower die. To avoid the problems associated with wire bonding to an unsupported die periphery, a preferred embodiment of the present invention comprises providing support for the periphery of the upper die before wire bonding the upper die.

In another preferred embodiment, a semiconductor device comprises a plurality of stacked dies coupled to a substrate. The dies are stacked with their edges staggered such that an upper die overhangs a lower die thereby forming a recess. The recess in the semiconductor device contains a support that avoids the problems associated with stacked, unsupported or cantilevered die.

In another preferred embodiment, the support includes filling a recess created by the overhanging, upper die with supporting adhesive layers containing a filler. The supporting adhesive layers surround the periphery of the lower die and lay beneath the unsupported cantilevered periphery of the upper die. In accordance with a preferred embodiment of the present invention, there is a plurality of adhesive layers.

In an alternative preferred embodiment, the filler contained in a supporting layer of adhesive is a dummy die. The dummy die has a thickness selected in accordance with the thickness of a die in the stacked package of the semiconductor package. In yet another alternative embodiment, a passive die, for example, acting as a capacitor, resistor, or inductor, replaces the dummy die.

An advantage of a preferred embodiment of the present invention is the wide availability of adhesives and fillers within the semiconductor industry. Die to substrate attachments are routine. Spherical particles of plastics, glasses, ceramics, polymers, inorganic compounds, epoxy and other materials are widely available in monodispersed sizes, which may be blended or combined as needed.

A further advantage of a preferred embodiment of the present invention is the ease and low cost of manufacturing. Existing bonding equipment requires little modification.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed below in detail. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely a semiconductor package comprising a substrate and two stacked dies. The invention may also apply, however, to other semiconductor devices that comprise more than two stacked dies, as well as to devices incorporating preferred embodiments of the invention on more than one level.

Figure 3:
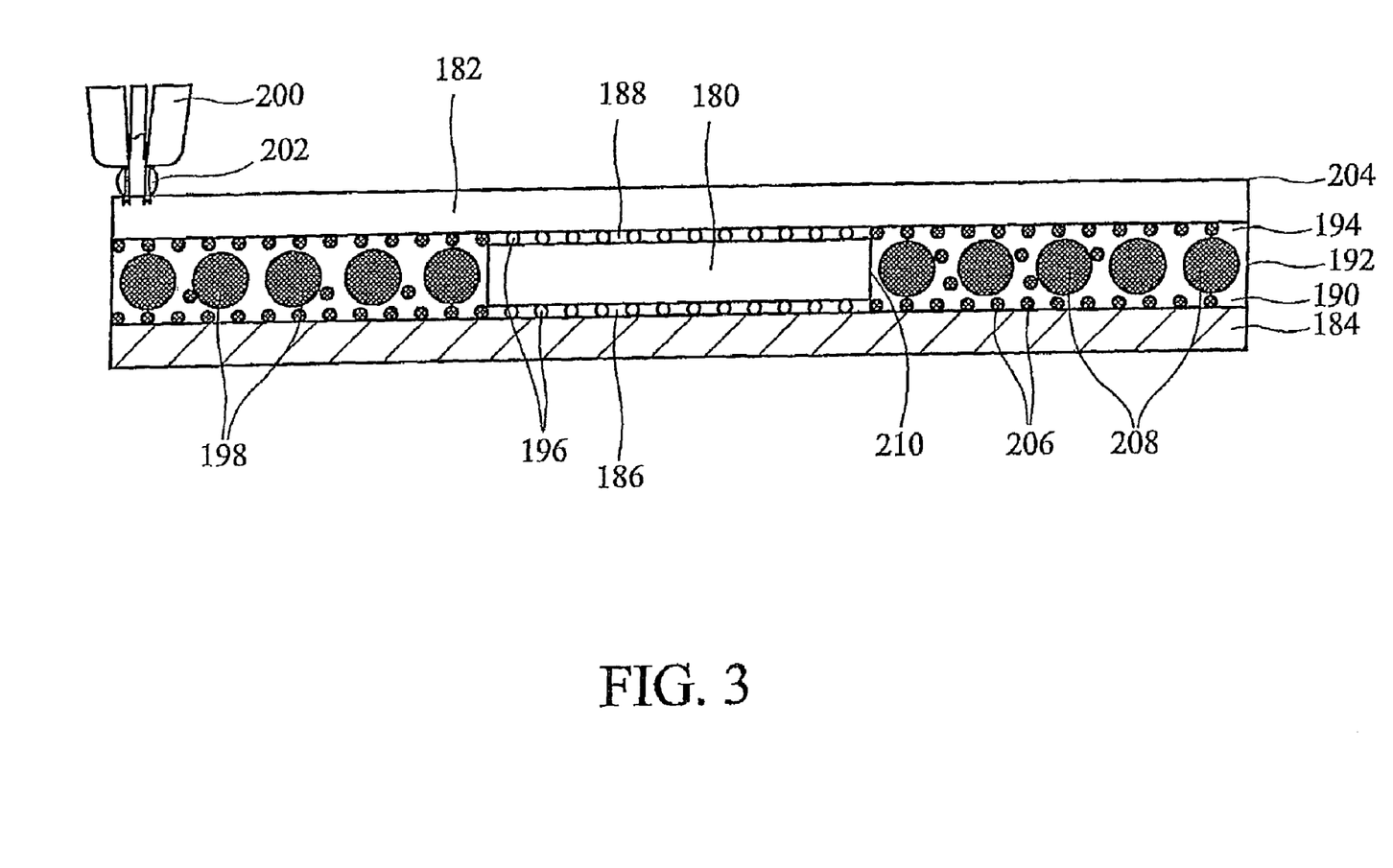
FIG. 3 is a cross sectional side elevation view of a semiconductor package made in accordance with a first exemplary embodiment of the present invention after the second die is mounted to the top surface of the first die.

With reference now to FIG. 3, there is shown a cross sectional view of an upper die 182 and a lower die 180 stacked upon a substrate 184 in accordance with a preferred embodiment of the present invention. The upper and lower dies each have opposite top and bottom surfaces and a lateral dimension. The lateral dimension of the upper die 182 is larger than a lateral dimension of the lower die 180, therefore at least one edge 204 of the upper die 182 overhangs at least one edge 210 of the lower die. Alternatively, the upper die 182 may have a smaller lateral dimension than the lower die 180, and overhang the lower die 180 only on one lateral side. In the stacked arrangement of this embodiment, the upper die 182 has a periphery cantilevered over the lower die 180. A conventional wire bond apparatus 200 may be used to attach a wire 202 to the top surface of the upper die 182 along its periphery.

The stacked die assembly of FIG. 3 includes a substrate 184 and a first adhesive layer 186 that attaches the coterminous sides of the lower die 180 and the substrate 184. The substrate may include one material or a first material and a second material. One of the materials may be a material selected from the group consisting of: glass, metal, ceramic, ceramic, metal, polymer, silicon substrate SOI substrate, PCB substrate and SiGe substrate. In one example, the substrate comprises a conductive trace formed therein. The substrate comprises conductive bumps or pins formed under the substrate. The coterminous faces of the upper die 182 and the lower die 180 are attached using a second layer of adhesive 188. The first and second layers of adhesive 186 and 188 preferably contain a filler comprising a layer of nonconductive microspheres 196 of substantially uniform size, thereby providing generally uniform spacing between the opposite, coterminous faces of the lower die 180 and the substrate 184 and between the opposite, coterminous faces of lower die 180 and the upper die 182. Preferably, the microspheres 196 are arranged substantially in a monolayer. The filler may comprise a first material and a second material that is selected from the group consisting of: glass, metal, ceramic, silicon dioxide, silicon nitride, epoxy, and polymer.

One parameter consideration in selecting a given size microsphere 196 is mounting pitch. The mounting pitch generally is the vertical distance between the top surface of a given die and the top surface of the immediately adjacent die. For example, in FIG. 3, the mounting pitch is the thickness of adhesive layer 194 plus the thickness of die 182. In device applications where package miniaturization may be important, the mounting pitch generally should be as small as possible. In accordance with a preferred embodiment of the present invention, the mounting pitch preferably is 125 microns or less. Approaches for reducing mounting pitch include reducing die thickness or reducing adhesive filler size. Alternatively, a mounting pitch of greater than 125 microns and up to approximately 750 microns may be used. The mounting pitch less than 125 microns is currently more practicable and is therefore preferred.

FIG. 3 shows that, in this preferred embodiment, the cantilevered periphery of the upper die is fully supported by three adhesive layers: 190, 192, and 194. The three layers are disposed outside of and may surround the lower die 180 and adhesive layers 186 and 188, which bond the lower die 180. In one embodiment, the three supporting layers may have a lateral extent approximately the same as the edge 204 of the overhanging die.

The first supporting adhesive layer 190 contains a layer of microspheres 206 having a size substantially the same as the microspheres 196 in the first bonding adhesive layer 186, which attaches lower die 180 to the substrate 184. In a preferred embodiment, the first bonding adhesive layer 186 and the first supporting adhesive layer 190 each contain a monolayer of microspheres of substantially uniform size. The bottom surface of the lower die 180 rests upon the microspheres in the first bonding adhesive layer 186. The first supporting adhesive layer 190 is applied to the surface of the substrate 184 so that the thickness of the first supporting adhesive layer 190 is substantially the same as the first bonding adhesive layer 186. In this embodiment, the two adhesive layers may form a continuous layer of substantially uniform thickness as shown in FIG. 3.

The second supporting adhesive layer 192 is disposed upon the first supporting adhesive layer 190, and generally contains a filler 208 comprising relatively larger microspheres 208. The size of the filler 208 in supporting adhesive layer 192 preferably is substantially the same as the thickness of the lower die 180.

In a preferred embodiment, the larger filler 208 in the second supporting adhesive layer 192 need not necessarily be of a strictly uniformed size or monodispersed. FIG. 3 shows that some intermingling or mixing of the filler between the plurality of adhesive layers. Furthermore, adding some small filler particles to adhesive layer 192 may fill in the spaces between the larger filler particles with the smaller particles instead of with adhesive. Within layer 192, the ratio of the diameter of the large to small microspheres preferably exceeds 1.1 to 10. In one example, the dimension of the filler is about higher than 30% of the recess height.

A third supporting adhesive layer 194 is disposed upon the second supporting adhesive layer 192. Layer 194 contains filler particles, which in this preferred embodiment are the same smaller microspheres 196 as in the first bonding adhesive layer 186. The third supporting layer 194 generally is applied to the second supporting layer 192 in a manner sufficient to substantially fill the overhanging, cantilevered periphery of the upper die 182.

As shown in FIG. 3, a larger die 182 rests upon a lower die 180. At least a portion of the periphery of the larger die 182 is cantilevered over the lower die 180. The edges of the stacked die are therefore staggered. Preferred embodiments fill a recess created by the cantilevered periphery of the upper die 182 with an adhesive having a filler, thus stabilizing the wire bonding process.

Finite element computer modeling has demonstrated the usefulness of this and other embodiments of the present invention. Modeling has focused on the principal stress of a cantilevered die model that represents a stacked die setup. Modeling has shown that for a given die thickness, the principal stress increases as the cantilevered length increases or as die thickness decreases. Failure of a cantilevered silicon die generally occurs when the principal stress exceeds 180 MPa. By way of example, this modeling has indicated that an overhang of 1.75 mm for a die 100 microns thick is currently beyond the capability of the prior art, with no supporting structure provided under the overhang.

The modes of failure observed with the cantilevered die vary, but are generally related to the deflection or vibration of the overhanging die. The die packaging failures ameliorated by the preferred embodiments include, by way of example, metal voids, wire tail residuals, ball deformation, die breakage, die chips, gap formation between die and molding compound, delamination, and overall production bottlenecks.

In another preferred embodiment of the present invention, the adhesive layers 190, 192, and 194 in FIG. 3 are replaced with a single adhesive layer wherein the adhesive contains a filler having a size substantially equal to the total recess created by the cantilevered die. Alternatively, a single layer of adhesive containing both sizes of particles may be used.

Figure 4:
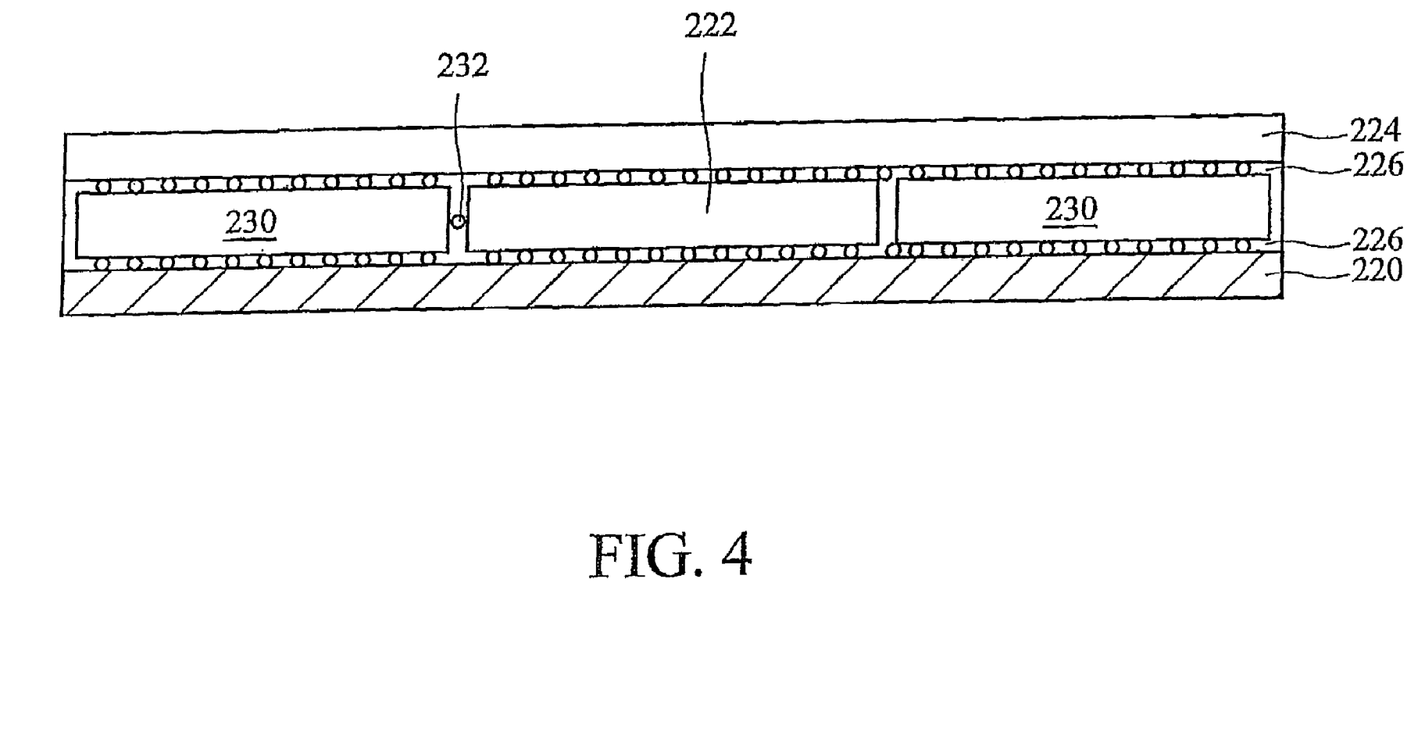
FIG. 4 is a cross sectional side elevation view of a pair of stacked dies made in accordance with a second exemplary embodiment of the present invention.

FIG. 4 shows another embodiment in which a solid supporting member 230 replaces the second supporting adhesive layer 192 shown in FIG. 3. In FIG. 4, as in the previous embodiment, there is a substrate 220, a lower die 222, and a relatively larger upper die 224. An adhesive 226 with microspheres 228 binds the components. In this embodiment, the filler is a die shaped filler 230 instead of the larger microspheres 198 of FIG. 3. An advantage of the embodiment shown in FIG. 4 is that the filler 230 may be a dummy die or an active die. It may also be a passive die acting as, for example, capacitors, resistors, or inductors. As in other embodiments, small microspheres 232 may be disposed between the die shaped filler 230 and the lower die 222 as spacers.

Figure 5:
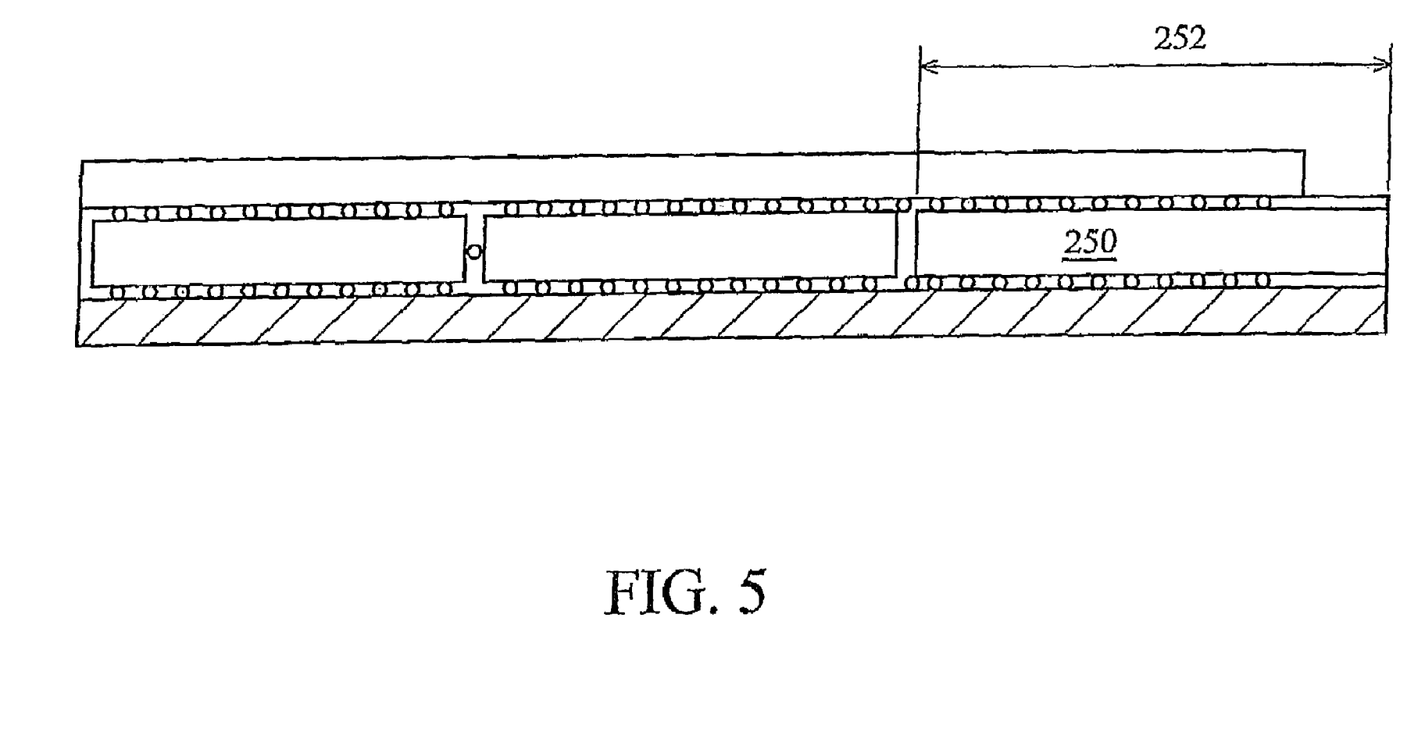
FIG. 5 is a cross sectional side elevation view of a pair of stacked dies made in accordance with a third exemplary embodiment of the present invention.

FIG. 5 shows a third embodiment of the invention wherein die-shaped spacer 250 has a lateral dimension 252 exceeding that necessary to support the cantilevered periphery of the upper die. In practice, the lateral dimension 252 may be larger or smaller than the overhang of the upper die. By adjusting the lateral dimension 252, this embodiment provides an additional method of controlling such parameters as, for example, signal distribution, power distribution, or heat dissipation in stacked semiconductor packages. If the spacer is smaller than the overhang of the upper die, then preferably the remaining overhang is less than the amount that would cause failure during wire bonding or other reliability problems.

Figure 6:
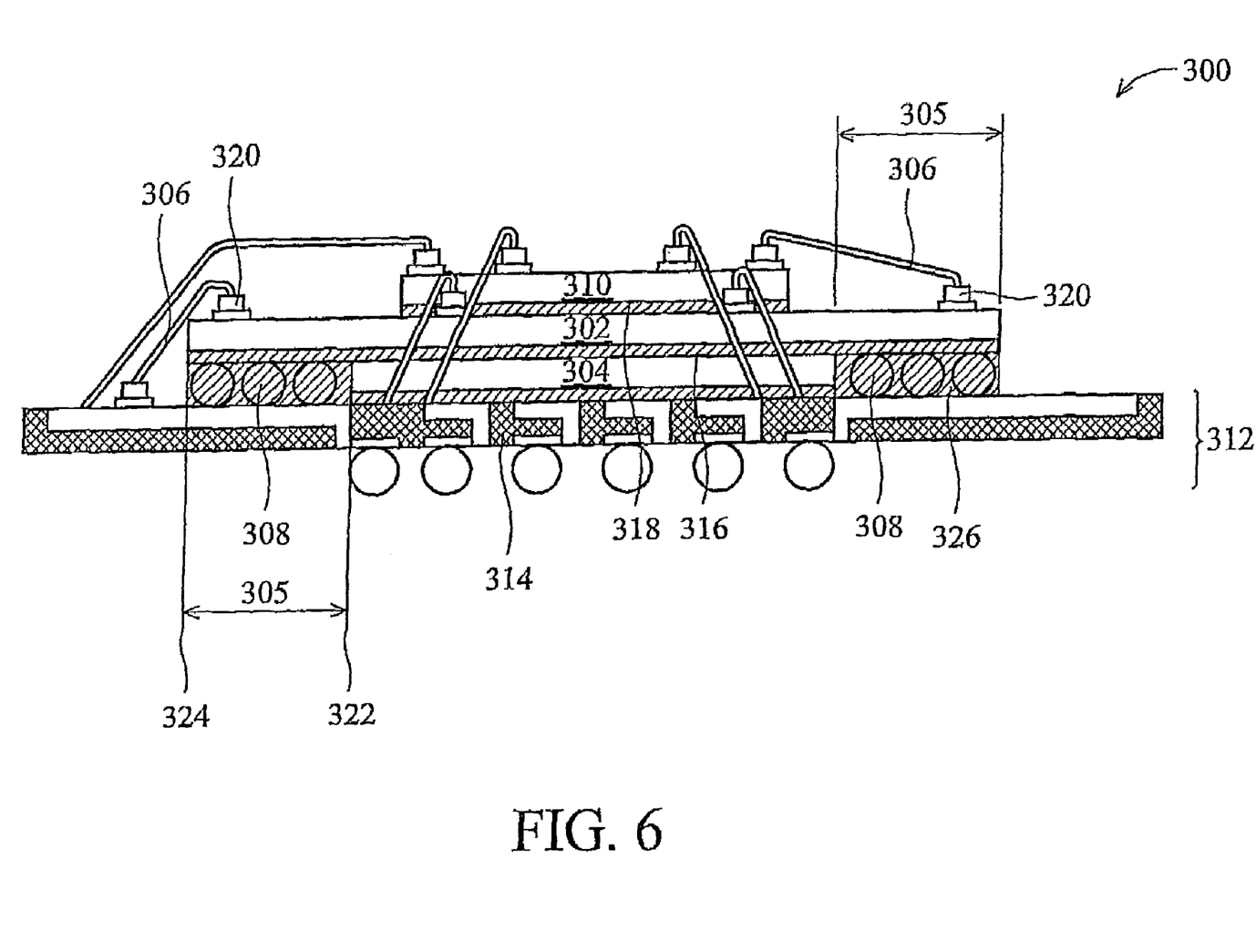
FIG. 6 is a cross sectional side elevation view of a semiconductor package with three stacked dies made in accordance with another exemplary embodiment of the present invention.

FIG. 6 illustrates a preferred embodiment BGA stacked die package 300. Making this assembly comprises stacking a plurality of die, at least two of which have different lateral dimensions, on a substrate.

Substrate 312 comprises a top surface, and is of a type known in the industry as suitable for a BGA type assembly 300. A first die 304 has opposite top and bottom sides, a specified lateral width, and an edge 322. The bottom surface of the first die 304 is attached to the top surface of the substrate 312 by a first adhesive layer 314. The attachment is performed using an automated die-attach apparatus.

A second die 302 has opposite top and bottom surfaces, a specified lateral width, an edge 324, and a plurality of wire bonding pads 320 located on the top surface of the periphery thereof. The lateral width of the second die 302 is greater than the lateral width of the first die 304. The bottom surface of the second die 302 is attached to the top surface of the first die 304 with a second adhesive layer 316. A plurality of fine, conductive wires 306 provide electrical connections within the stacked die package 300.

As shown in FIG. 6, the edges of the respective dies, 324 and 322, are staggered. As such, the periphery of the second die 302 is cantilevered over the first die 304. The bottom surface of the top die 302, the edge 322 of the first die 304, and the top surface of the substrate 312 thereby form a recess. A preferred embodiment of the present invention provides support for the cantilevered periphery 305 by filling the recess space.

As shown in FIG. 6, the recess under the cantilevered periphery 305 is filled with a supporting adhesive 326. A filler comprising microspheres 308 having a specified diameter is contained in the supporting adhesive 326. The diameter of the microspheres 308 generally is sufficient to substantially fill the distance between the top surface of the substrate 312 and the bottom surface of the second die 302. The supporting adhesive 326 is added to the recess under the cantilevered periphery 305 of the second die 302 until the recess is substantially filled, whereby the cantilevered periphery 305 of the second die 302 is supported from below.

The materials used to make the package 300 shown in FIG. 6 generally are widely available throughout the semiconductor industry. For example, with respect to the adhesives, Ablestick2000B (available from Abelstik Co., Rancho Dominquez, Calif., USA) and Loctite QMI536 (available from Henkel Corp., San Diego, Calif., USA) may be used for the first adhesive layer 314 and second adhesive layer 316, respectively.

As FIG. 6 illustrates, embodiments of the invention are not limited to an arrangement of two stacked dies. In this case, a third die 310 is bonded to the top surface of the second die 302 using adhesive 318. In other situations, the third die 310 is easily replaced (not shown) with yet another plurality of stacked dies, some having staggered edges or cantilevered peripheries. Nor are embodiments of the present invention limited to specific materials. For example, glasses, ceramics, metals, polymers, or other materials are suitable materials for the substrate. These embodiments, as well as others not specified, are within the scope of the invention. For example, an embodiment of the present invention may be implemented in the device of FIG. 1. As another example, it will be readily understood by those skilled in the art that the number of stacked dies, the amount of die overhang, die thickness, materials, or methods, may be varied while remaining within the scope of the present invention.

The embodiments herein also allow for a method of reducing vibration incurred by a wire bonding process. The method comprises providing a substrate; attaching a stack of semiconductor dies to the substrate, the stack including an upper die and a lower die, an adhesive layer for bonding the top surface of the lower die to the bottom surface of the upper die so that the upper die lateral periphery is cantilevered over the lower die lateral periphery thereby forming a recess; and reducing the mounting height of said stacked dies by decreasing die thickness or by using smaller fillers between said stacked dies. The dimension of the mounting pitch is less than 125 um.

Although the present invention and its advantages have been described in detail, it should be understood that various changes, substitutions, and alterations can be made herein without departing from the spirit and scope of the invention as defined by the appended claims. The stacking of semiconductor dies is a manufacturing method commonly employed in the semiconductor industry. See, for example, U.S. Pat. No. 6,717,251 to M. Matsuo et al.; U.S. Pat. No. 6,680,219 to E.

Reyes et al.; U.S. Pat. No. 6,650,019 to T. P. Glenn et al.; U.S. Pat. No. 6,472,758 to T. P. Glenn et al., which patents are hereby incorporated herein by reference. The embodiments described herein are effective in solving many problems encountered when wire bonding to a cantilevered die periphery.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor fabrication method comprising:
   providing a plurality of semiconductor dies, the dies being stacked with at least two die edges staggered so that an upper die edge overhangs a lower die edge, thereby forming a recess;
   bonding adjacent die surfaces using a first adhesive, the first adhesive containing a first filler; and
   disposing a second adhesive within each recess, the second adhesive containing a second filler, the second filler having a size approximately the same as a height of the lower die edge.

2. The method of claim 1, wherein the die edge plus the uniform space between the adjacent, bonded die surfaces is less than 125 microns.

3. The method of claim 1, wherein the first filler and the second filler comprise microspheres.

4. The method of claim 3, wherein a ratio of the second filler diameter to the first filler diameter is about 1.1 to 10.

5. The method of claim 1, wherein the first filler comprises microspheres and the second filler comprises a die, and wherein the die is selected from the group consisting of: a dummy die, an active die and a passive die.

6. The method of claim 1, further comprising interposing spacers between the second filler.

7. The method of claim 6, wherein the spacers are microspheres.

8. A method for fabricating a semiconductor package having stacked dies, the method comprising:
   providing a substrate;
   attaching a stack of semiconductor dies to the substrate, the stack comprising an upper die having opposite top and bottom surfaces and a lateral periphery, a lower die having opposite top and bottom surfaces and a lateral periphery smaller than the lateral periphery of the upper die, an adhesive layer for bonding the top surface of the lower die to the bottom surface of the upper die so that the upper die lateral periphery is cantilevered over the lower die lateral periphery thereby forming a recess; and
   supporting the upper die lateral periphery with a supporting adhesive layer containing a filler, the supporting adhesive layer disposed upon the substrate about the lateral periphery of the lower die and substantially filling the recess.

9. The method of claim 8, wherein the substrate comprises a material, and wherein the material is selected from the group consisting of: glass, ceramic, metal, polymer, Silicon substrate, SOI substrate, PCB substrate and SiGe substrate.

10. The method of claim 8, wherein the adhesive layer for bonding the top surface of the lower die to the bottom surface of the upper die further comprises a plurality of spacers interposed between the coterminous faces of the top surface of the lower die and the bottom surface of the upper die.

11. The method of claim 10, wherein the spacers comprise a material, and wherein the material is selected from the group consisting of: glass, metal, ceramic, silicon dioxide, silicon nitride, epoxy, and polymer.

12. The method of claim 11, wherein the spacers comprise microspheres.

13. The method of claim 11, wherein the spacers comprise microspheres arranged substantially in a monolayer.

14. The method of claim 8, wherein the filler comprises a material, and wherein the material is selected from the group consisting of: glass, silicon dioxide, silicon nitride, epoxy and polymer.

15. The method of claim 8, wherein a mounting pitch between the top surface of the lower die and the top surface of the upper die is less than 125 microns.

16. The method of claim 8, wherein the filler comprises microspheres.

17. The method of claim 8, wherein the filler comprises a predetermined ratio of large to small microspheres, the diameter of the large microspheres being substantially equal to the recess.

18. The method of claim 8, wherein the supporting adhesive layer further comprises spacers interposed between the filler.

19. The method of claim 18, wherein the spacers are microspheres.

20. The method of claim 8, further comprising connecting electrically conductive wires to the semiconductor dies and the substrate.

21. A method of reducing vibration incurred by a wire bonding process, the method comprising:
   providing a substrate;
   attaching a stack of semiconductor dies to the substrate, the stack comprising an upper die and a lower die, a first adhesive layer for bonding the top surface of the lower die to the bottom surface of the upper die so that the upper die lateral periphery is cantilevered over the lower die lateral periphery thereby forming a recess, a second adhesive layer in the recess, the second adhesive layer including fillers having a dimension greater than a thickness of the first adhesive layer; and
   reducing the mounting height of the stacked dies by decreasing die thickness or by using smaller fillers between the stacked dies.

22. The method of claim 21 wherein a mounting pitch between the top surface of the lower die and the top surface of the upper die is less than 125 um.

23. The method of claim 21, wherein the substrate comprises a material, and wherein the material is selected from the group consisting of: glass, ceramic, metal, polymer, silicon substrate, SOI substrate, PCB substrate and SiGe substrate.

* * * * *